United States Patent
Sakai et al.

(10) Patent No.: US 10,151,976 B2
(45) Date of Patent: Dec. 11, 2018

(54) SOLDER RESIST COMPOSITION, AND COVERED-PRINTED WIRING BOARD

(71) Applicant: GOO CHEMICAL CO., LTD., Kyoto (JP)

(72) Inventors: Yoshio Sakai, Shiga (JP); Michiya Higuchi, Kyoto (JP)

(73) Assignee: GOO CHEMICAL CO., LTD., Kyoto (JP)

( * ) Notice: Subject to any disclaimer, the term of this patent is extended or adjusted under 35 U.S.C. 154(b) by 0 days.

(21) Appl. No.: 15/532,978

(22) PCT Filed: Aug. 17, 2015

(86) PCT No.: PCT/JP2015/004079
§ 371 (c)(1),
(2) Date: Jun. 2, 2017

(87) PCT Pub. No.: WO2016/092717
PCT Pub. Date: Jun. 16, 2016

(65) Prior Publication Data
US 2017/0336708 A1 Nov. 23, 2017

(30) Foreign Application Priority Data
Dec. 10, 2014 (WO) .................. PCT/JP2014/006157

(51) Int. Cl.
| | |
|---|---|
| G03F 7/038 | (2006.01) |
| G03F 7/031 | (2006.01) |
| G03F 7/029 | (2006.01) |
| G03F 7/20 | (2006.01) |
| G03F 7/32 | (2006.01) |
| G03F 7/004 | (2006.01) |
| H05K 1/03 | (2006.01) |
| H05K 3/28 | (2006.01) |
| H05K 1/02 | (2006.01) |

(52) U.S. Cl.
CPC ............ *G03F 7/031* (2013.01); *G03F 7/0043* (2013.01); *G03F 7/029* (2013.01); *G03F 7/038* (2013.01); *G03F 7/0385* (2013.01); *G03F 7/0388* (2013.01); *G03F 7/2006* (2013.01); *G03F 7/322* (2013.01); *H05K 1/0274* (2013.01); *H05K 1/0353* (2013.01); *H05K 3/282* (2013.01); *H05K 3/287* (2013.01); *H05K 2201/0166* (2013.01)

(58) Field of Classification Search
CPC ...... G03F 7/0388; G03F 7/031; G03F 7/0043; G03F 7/2006; G03F 7/0385; G03F 7/038; G03F 7/029; G03F 7/322; H05K 3/287; H05K 3/282; H05K 1/0353; H05K 1/0274; H05K 2201/0166
USPC ..................................................... 430/280.1
See application file for complete search history.

(56) References Cited

U.S. PATENT DOCUMENTS

| | | | |
|---|---|---|---|
| 6,099,123 A | 8/2000 | Engardio et al. | |
| 6,238,840 B1 | 5/2001 | Hirayama et al. | |
| 6,465,540 B1 | 10/2002 | Kubo et al. | |
| 6,498,883 B1 | 12/2002 | Wilson | |
| 6,562,464 B1 | 5/2003 | Schwalm et al. | |
| 7,329,713 B2 | 2/2008 | Schorr | |
| 8,940,804 B2 | 1/2015 | Rrahimi | |
| 2003/0060043 A1 | 3/2003 | Hosomi et al. | |
| 2003/0100627 A1 | 5/2003 | Bishop et al. | |
| 2003/0109599 A1 | 6/2003 | Kamen | |
| 2004/0151843 A1 | 8/2004 | Weingartz | |
| 2004/0152798 A1 | 8/2004 | Weissman et al. | |
| 2004/0206123 A1 | 10/2004 | Fotheringham et al. | |
| 2005/0228062 A1 | 10/2005 | Wolf et al. | |
| 2006/0060841 A1 | 3/2006 | Kim et al. | |
| 2007/0105972 A1 | 5/2007 | Doyle et al. | |
| 2007/0134847 A1 | 6/2007 | Kang et al. | |
| 2007/0264601 A1 | 11/2007 | Uematsu et al. | |
| 2008/0090930 A1 | 4/2008 | Madhusoodhanan et al. | |
| 2009/0015548 A1* | 1/2009 | Tazaki .................. G06F 3/0308 345/156 |
| 2009/0087759 A1 | 4/2009 | Matsumoto et al. | |
| 2009/0099330 A1 | 4/2009 | Okada et al. | |
| 2010/0022676 A1 | 1/2010 | Rogers et al. | |
| 2010/0027950 A1 | 2/2010 | Suzumura et al. | |
| 2010/0209843 A1 | 8/2010 | Sato | |
| 2010/0329616 A1 | 12/2010 | Chen et al. | |

(Continued)

FOREIGN PATENT DOCUMENTS

| | | |
|---|---|---|
| CN | 1267688 A | 9/2000 |
| CN | 1511116 A | 7/2004 |

(Continued)

OTHER PUBLICATIONS

English translation of WO 2016092592 a1 as generated Sep. 30, 2017 from Patentscope translated by Wipo Translate, 34 pages.*

(Continued)

*Primary Examiner* — Cynthia Hamilton
(74) *Attorney, Agent, or Firm* — Cheng Law Group, PLLC

(57) ABSTRACT

A solder resist composition includes: (A) a carboxyl group-containing resin; (B) an epoxy compound; (C) titanium dioxide; (D) a photopolymerization initiator; and (E) an antioxidant. The component (B) contains a hydroquinone epoxy compound represented by following formula (1). The component (D) contains (D1) a bisacylphosphine oxide-based photopolymerization initiator and (D2) an α-hydroxy alkylphenone-based photopolymerization initiator.

[Chemical 1]

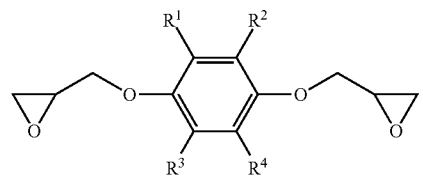

(1)

6 Claims, No Drawings

(56) References Cited

U.S. PATENT DOCUMENTS

| | | |
|---|---|---|
| 2011/0218266 A1 | 9/2011 | Studer et al. |
| 2012/0148833 A1 | 6/2012 | Cao et al. |
| 2012/0178020 A1 | 7/2012 | Lawton et al. |
| 2012/0270961 A1 | 10/2012 | Kotani |
| 2013/0116358 A1 | 5/2013 | Rrahimi |
| 2013/0123382 A1 | 5/2013 | Ito et al. |
| 2013/0303649 A1 | 11/2013 | Ichiryu et al. |
| 2014/0154471 A1 | 6/2014 | Kodama et al. |
| 2014/0186766 A1 | 7/2014 | Higuchi et al. |
| 2014/0220367 A1 | 8/2014 | Neddersen |
| 2014/0308613 A1 | 10/2014 | Higuchi et al. |
| 2014/0336298 A1 | 11/2014 | Hiraoka |
| 2015/0304639 A1 | 10/2015 | Lin |
| 2015/0329735 A1 | 11/2015 | Nakamura et al. |
| 2016/0011506 A1 | 1/2016 | Gu et al. |
| 2016/0139505 A1 | 5/2016 | Taguchi et al. |
| 2017/0017152 A1* | 1/2017 | Sakai ............... G03F 7/031 |
| 2017/0269477 A1* | 9/2017 | Higuchi ............. G03F 7/029 |
| 2018/0129135 A1 | 5/2018 | Sakai |
| 2018/0136559 A1 | 5/2018 | Sakai |

FOREIGN PATENT DOCUMENTS

| | | |
|---|---|---|
| CN | 1181949 C | 12/2004 |
| CN | 101044434 A | 9/2007 |
| CN | 101321727 A | 12/2008 |
| CN | 101798432 A | 8/2010 |
| CN | 102639466 A | 8/2012 |
| CN | 102796348 A | 11/2012 |
| CN | 103748131 A | 4/2014 |
| CN | 103881473 A | 6/2014 |
| CN | 103946262 A | 7/2014 |
| CN | 104140715 A | 11/2014 |
| JP | 2002-540243 A | 11/2002 |
| JP | 2005-523923 A | 8/2005 |
| JP | 2006-64890 A | 3/2006 |
| JP | 2007-322546 A | 12/2007 |
| JP | 2008-107511 A | 5/2008 |
| JP | 4538521 B2 | 9/2010 |
| JP | 2010-266556 A | 11/2010 |
| JP | 2011-227343 A | 11/2011 |
| JP | 2012-53229 A | 3/2012 |
| JP | 2012-78414 A | 4/2012 |
| JP | 2012-108523 A | 6/2012 |
| JP | 2012-215716 A | 11/2012 |
| JP | 2013-36027 A | 2/2013 |
| JP | 2013-137373 A | 7/2013 |
| JP | 2013-210443 A | 10/2013 |
| JP | 2014-63158 A | 4/2014 |
| JP | 2015-41058 A | 3/2015 |
| KR | 10-2010-0024893 A | 3/2010 |
| KR | 10-2010-0087246 A | 8/2010 |
| TW | 200908839 A | 2/2009 |
| TW | 201033161 A | 9/2010 |
| TW | 201335213 A1 | 9/2013 |
| WO | WO-2008/029816 A1 | 3/2008 |
| WO | WO-2013/048615 A1 | 4/2013 |
| WO | WO-2014/132928 A1 | 9/2014 |
| WO | WO-2015/060240 A1 | 4/2015 |
| WO | WO 2016/092595 A1 * | 6/2016 |
| WO | WO 2016/092718 A1 * | 6/2016 |

OTHER PUBLICATIONS

English translation of CN 101798432 a cited by applicants, translation obtained from Espacenet, European patent office website on Apr. 10, 2018, 11 pages. (Year: 2018).*

English translation of CN 102796348 a cited by applicants, translation obtained from Espacenet, European patent office website on Apr. 10, 2018, 17 pages. (Year: 2018).*

International Search Report for the Application No. PCT/JP2015/004079 dated Nov. 10, 2015.

CIBA, Photoinitiators for UV Curing, 2000.

Final Office Action for U.S. Appl. No. 15/124,469, from the United States Patent and Trademark Office dated Jul. 12, 2017.

Supplementary European Search Report for the Application No. EP 15 86 8034 dated Aug. 24, 2017.

Notification of the First Office Action for the Application No. 201580066803.X from The State Intellectual Property Office of the People's Republic of China dated Jan. 11, 2018.

Non-Final Office Action for U.S. Appl. No. 15/124,469 from the United States Patent and Trademark Office dated Oct. 1, 2018.

Non-Final Office Action for U.S. Appl. No. 15/805,756 from the United States Patent and Trademark Office dated Oct. 2, 2018.

* cited by examiner

SOLDER RESIST COMPOSITION, AND COVERED-PRINTED WIRING BOARD

TECHNICAL FIELD

The present invention relates to solder resist compositions and covered-printed wiring boards, and specifically relates to: a solder resist composition which has photocurability and can be developed with an alkaline solution; and a covered-printed wiring board including a solder resist layer formed with the solder resist composition.

BACKGROUND ART

In recent years, as a method for forming solder resist layers on printed wiring boards for consumer use and industrial use, a developable solder resist composition with excellent resolution and dimensional accuracy has been widely used, instead of a screen printing method, in order to increase the density of wiring on the printed wiring board.

Additionally, in recent years, there is an increasing use of optical elements, such as light-emitting diodes, mounted directly on a printed wiring board covered with a solder resist layer, wherein the light-emitting diodes are often used for: backlights in liquid crystal displays for mobile terminals, personal computers, and televisions; and light sources for lighting devices. Furthermore, when titanium dioxide is contained in the solder resist layer on the printed wiring board mounted with optical elements, the solder resist layer is whitened and therefore light emitted from the optical elements is efficiently reflected at the solder resist layer (see JP2012-78414A).

However, in a process of curing the solder resist composition under exposure to light, titanium dioxide contained in the solder resist composition may cause difficulty in curing of the solder resist composition due to titanium dioxide reflecting or absorbing light. Especially when the solder resist composition contains a large amount of titanium dioxide, it is difficult for the solder resist layer formed with the solder resist composition to completely cure from a surface to a deep part. If the deep part of the solder resist layer is not thoroughly cured, it is likely for defects to occur, such as lowered resolution in development and cracks in the solder resist layer when heated due to a partial stress caused by a difference in thermal expansion coefficients of the printed wiring board and the solder resist layer.

In addition, the solder resist layer containing the solder resist composition tends to be fragile, which leads to cracks in the solder resist layer caused during machine processing.

Furthermore, it is required for the solder resist layer to be high in light resistance, heat resistant, and heat discoloration resistance.

SUMMARY OF INVENTION

The present invention has been made in light of the above-described circumstances, and it is an object thereof to provide: a solder resist composition which can be, by photocuring, formed into a solder resist layer, the solder resist layer being thoroughly cured from a surface to a deep part, being less likely to be fragile, and having high light resistance, heat resistance, and heat discoloration resistance; and a covered-printed wiring board including the solder resist layer formed with the solder resist composition.

A solder resist composition according to the present invention includes: (A) a carboxyl group-containing resin; (B) an epoxy compound; (C) titanium dioxide; (D) a photopolymerization initiator; and (E) an antioxidant, the component (B) contains a hydroquinone epoxy compound represented by following formula (1), and the component (D) contains (D1) a bisacylphosphine oxide-based photopolymerization initiator and (D2) an α-hydroxy alkyiphenone-based photopolymerization initiator.

[Chemical 1]

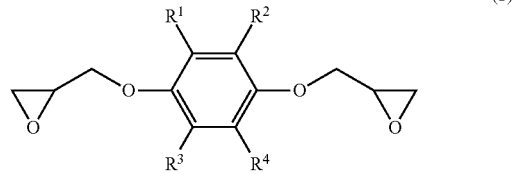

(1)

$R^1$, $R^2$, $R^3$, and $R^4$ in the formula (1) are independently a methyl group, a hydrogen atom, or a t-butyl group.

A covered-printed wiring board according to the present invention includes: a printed wiring board; and a solder resist layer covering the printed wiring board, and the solder resist layer includes a cured product of the solder resist composition.

According to the present invention, the solder resist composition can be, by photocuring, formed into the solder resist layer, the solder resist layer being thoroughly cured from a surface to a deep part, being less likely to be fragile, and having high light resistance, heat resistance, and heat discoloration resistance.

In addition, according to the present invention, the covered-printed wiring board including the solder resist layer which is thoroughly cured from the surface to the deep part, with suppressed occurrence of cracks, and has high light resistance, heat resistance, and heat discoloration resistance can be provided.

DESCRIPTION OF EMBODIMENTS

An embodiment for implementing the present invention is now described. It should be noted that in the description from now on, "(meth)acryl" means at least one of "acryl" and "methacryl". For example, (meth)acrylate means at least one of acrylate and methacrylate.

A solder resist composition according to the present embodiment includes: (A) a carboxyl group-containing resin; (B) an epoxy compound; (C) titanium dioxide; (D) a photopolymerization initiator; and (E) an antioxidant. The component (B) contains a hydroquinone epoxy compound represented by following formula (1). The component (D) contains (D1) a bisacylphosphine oxide-based photopolymerization initiator and (D2) an α-hydroxy alkylphenone-based photopolymerization initiator.

[Chemical 2]

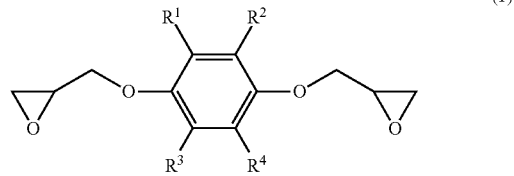

(1)

$R^1$, $R^2$, $R^3$, and $R^4$ in the formula (1) are independently a methyl group, a hydrogen atom, or a t-butyl group.

A covered-printed wiring board according to the present embodiment includes a solder resist layer including a photocured product of the solder resist composition.

In the present embodiment, since the hydroquinone epoxy compound represented by the formula (1) in the solder resist composition has only one aromatic ring, a long conjugated bond is less likely to occur even if the solder resist layer including this hydroquinone epoxy compound is decomposed due to heat or light. Furthermore, the hydroquinone epoxy compound does not contain a nitrogen atom or a sulfur atom. As a result, the solder resist layer tends not to discolor. In addition, since the hydroquinone epoxy compound is bifunctional and contains an ether bond, the solder resist layer has a reduced brittleness and gains flexibility. Thus the solder resist layer has suppressed occurrence of cracks such as a crack caused by machine processing of the solder resist layer and a heat crack caused by a difference in thermal expansion coefficients of a substrate and the resist layer when the solder resist layer is heated.

Further, the hydroquinone epoxy compound has an aromatic ring and thus contributes to an improvement in the heat resistance of the solder resist layer. In addition, a melting point of the hydroquinone epoxy compound is as high as about 138 to 145° C. Thus, when the solder resist composition is dried by heating at a relatively low temperature around 60 to 80° C. to form a dry coating film, the component (A) (the carboxyl group-containing resin) and the hydroquinone epoxy compound are not easily reacted. Accordingly, the component (A) tends to remain unreacted in the dry coating film. Therefore, the dry coating film is first exposed to light and then developed so that high alkali developability can be assured in formation of a film.

Moreover, the hydroquinone epoxy compound represented by the formula (1) is contained in the solder resist composition and thus contributes to suppression of tackiness of the dry coating film formed with the solder resist composition. When the solder resist composition contains not only the hydroquinone epoxy compound but also an epoxy compound with a high melting point, the tackiness of the dry coating film is further suppressed.

Furthermore, when the film after development is heated at an appropriate temperature, for example at 150° C., the hydroquinone epoxy compound in the film easily softens or melts, leading to a thermosetting reaction in the film involving the hydroquinone epoxy compound. Consequently, the film gains high heat resistance.

Also, as mentioned above, the component (D) contains the component (D1) (the bisacylphosphine oxide-based photopolymerization initiator) and the component (D2) (the α-hydroxy alkylphenone-based photopolymerization initiator). The component (D1) has high absorbability of active energy rays of wavelengths larger than 380 nm. Due to this, the solder resist composition containing the component (D1) has high photocurability despite containing the titanium dioxide. Further, since the component (D1) is bleached due to a photobleaching effect when exposed to light, the component (D1) tends not to color the solder resist layer. Therefore, the component (D1) tends not to inhibit light reflectivity of the solder resist layer.

In addition, since a surface of the solder resist layer is highly susceptible to an oxygen inhibition during photocuring, the component (D1) alone is not enough to thoroughly cure the surface of the solder resist layer. However, since the solder resist composition also contains the component (D2) and the component (E) in the present embodiment, the oxygen inhibition is prevented and thus the solder resist layer tends to be cured from the surface to a deep part. The solder resist layer which is thoroughly cured from the surface to the deep part has high homogeneity. Therefore, even when the solder resist layer is deformed due to heat during steps such as soldering and reflow and thus experiences stress, the stress tends to be distributed throughout the solder resist layer, leading to less occurrence of cracks. Furthermore, since the solder resist layer contains the component (E), the solder resist layer tends not to be easily colored even when exposed to high temperature or light, leading to prevention of lowering in the light reflectivity and yellowing of the solder resist layer.

Moreover, since the solder resist composition contains the component (E), an effect of suppressing a cross-linking reaction and a decomposition reaction in the solder resist composition is gained. Therefore, when the solder resist composition contains the component (E), the solder resist composition can gain cross-linking reactivity depending on a concentration of the component (E), which enables appropriate controlling of an amount of cross-linkages in the solder resist layer. Therefore, adhesiveness of the solder resist layer can be improved.

Furthermore, when the solder resist composition contains the component (E) as well as the hydroquinone epoxy compound represented by the formula (1), the solder resist layer gains appropriate flexibility, and at the same time adhesiveness of the solder resist layer to a printed wiring board is improved. Moreover, various resist properties of the solder resist layer such as plating solution resistance become favorable.

Therefore, in the present embodiment, a solder resist composition can be, by photocuring, formed into a solder resist layer, and the solder resist layer is thoroughly cured from the surface to the deep part, is less likely to be fragile, and has high light resistance, heat resistance, and heat discoloration resistance.

The solder resist composition according to the present embodiment will be further described specifically hereinafter.

The component (A) can provide a coating film formed with the solder resist composition with developability in an alkaline solution, i.e., alkaline developability.

The component (A) may contain a compound (hereinafter referred to as a component (A1)) which contains a carboxyl group but is not photopolymerizable.

The component (A1) contains, for example, a polymer of an ethylene-based unsaturated monomer including an ethylene-based unsaturated compound which contains a carboxyl group. The ethylene-based unsaturated monomer may further contain an ethylene-based unsaturated compound which does not contain any carboxyl groups.

The ethylene-based unsaturated compound which contains a carboxyl group may contain appropriate polymers and prepolymers, and may contain, for example, a compound which contains only one ethylene-based unsaturated group. More specifically, the ethylene-based unsaturated compound which contains a carboxyl group may contain one or more kinds of compounds selected from a group consisting of, for example, acrylic acid, methacrylic acid, ω-carboxyl-polycaprolactone (n≈2) monoacrylate, crotonic acid, cinnamic acid, 2-acryloyloxyethyl succinic acid, 2-methacryloyloxyethyl succinic acid, 2-acryloyloxyethyl phthalic acid, 2-methacryloyloxyethyl phthalic acid, 2-acryloyloxypropyl phthalic acid, 2-methacryloyloxypropyl phthalic acid, 2-acryloyloxyethyl maleic acid, 2-methacryloyloxyethyl maleic acid, β-carboxyethylacrylate, 2-acryloyloxyethyl tetrahydrophthalic acid, 2-methacryloyloxyethyl tetrahydrophthalic acid, 2-acryloyloxyethyl hexahydrophthalic acid, and 2-methacryloyloxyethyl hexahydrophthalic acid. The ethylene-based unsaturated compound which contains a carboxyl group may also contain a compound which contains multiple ethylene-based unsaturated groups. More specifically, for example, the ethylene-based unsaturated compound which contains a carboxyl group may contain a compound obtained by reacting a dibasic acid anhydride with a polyfunctional (meth)acrylate which contains a hydroxyl group selected from a group consisting of pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate. These compounds may be used alone or in combination.

The ethylene-based unsaturated compound which does not contain any carboxyl groups may be any compound as long as it is copolymerizable with the ethylene-based unsaturated compound which contains a carboxyl group. The ethylene-based unsaturated compound which does not contain any carboxyl groups may contain either one of an aromatic ring-containing compound and an aromatic ring-free compound.

The aromatic ring-containing compound may contain one or more kinds of compounds selected from a group consisting of, for example, 2-(meth)acryloyloxyethyl-2-hydroxyethyl phthalate, benzyl (meth)acrylate, neopentyl glycol benzoate (meth)acrylate, paracumyl phenoxyethylene glycol (meth)acrylate, EO-modified cresol (meth)acrylate, ethoxylated phenyl (meth)acrylate, nonylphenoxy polyethylene glycol (meth)acrylate (n=2–17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth) acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, N-phenylmaleimide, N-benzylmaleimide, N-vinylcarbazole, styrene, vinylnaphthalene, and 4-vinylbiphenyl.

The aromatic ring-free compound may contain one or more kinds of compounds selected from a group consisting of, for example, straight or branched aliphatic (meth)acrylic acid esters or alicyclic (meth)acrylic acid esters (which may contain unsaturated bonding partially in a carbon ring), hydroxyalkyl (meth)acrylates, alkoxyalkyl (meth)acrylates, and N-substituted maleimides such as N-cyclohexylmaleimide. The aromatic ring-free compound may further contain a compound which contains two or more ethylene-based unsaturated groups per molecule, such as polyethylene glycol di(meth)acrylate, polypropylene glycol di(meth)acrylate, trimethylolpropane tri(meth)acrylate, and pentaerythritol tri(meth)acrylate. These compounds may be used alone or in combination. These compounds are preferred since hardness and oiliness of the solder resist layer can be easily adjusted.

Kinds and ratios of compounds used to obtain the component (A1) are appropriately selected so that an acid value of the component (A1) is an appropriate value. The acid value of the component (A1) is preferably within a range of 20 to 180 mgKOH/g and further preferably within a range of 35 to 165 mgKOH/g.

The carboxyl group-containing resin may also contain photopolymerizable carboxyl group-containing resin (hereinafter referred to as a component (A2)) which contains a carboxyl group and a photopolymerizable functional group. The photopolymerizable functional group is, for example, an ethylene-based unsaturated compound.

The component (A2) may contain resin (hereinafter referred to as first resin (a)), for example, having a structure resulting from an addition reaction of: at least one kind of a compound (a3) selected from polycarboxylic acids and anhydrides thereof; and a secondary hydroxyl group obtained from a reaction between an ethylene-based unsaturated compound (a2) which contains a carboxyl group, and at least one epoxy group in an epoxy compound (a1) which contains two or more epoxy groups per molecule.

The epoxy compound (a1) may contain at least one kind of compound selected from a group consisting of, for example, cresol novolak type epoxy resin, phenol novolak type epoxy resin, bisphenol A type epoxy resin, bisphenol F type epoxy resin, bisphenol A-novolak type epoxy resin, naphthalene type epoxy resin, biphenyl type epoxy resin, biphenyl aralkyl type epoxy resin, triglycidyl isocyanurate, and alicyclic epoxy resin.

The epoxy compound (a1) may contain a polymer of an ethylene-based unsaturated compound (p) which includes an epoxy group-containing compound (p1). The ethylene-based unsaturated compound (p) provided for a synthesis of the polymer may contain the epoxy group-containing compound (p1) alone or in combination with an epoxy group-free compound (p2).

The epoxy group-containing compound (p1) may contain a compound selected from appropriate polymers and prepolymers. Specifically, the epoxy group-containing compound (p1) may contain one or more kinds of compounds selected from a group consisting of epoxy cyclohexyl derivatives of acrylic acids, epoxy cyclohexyl derivatives of methacrylic acids, an alicyclic epoxy derivative of an acrylate, an alicyclic epoxy derivative of a methacrylate, β-methyl glycidyl acrylate, and β-methyl glycidyl methacrylate. Especially, the epoxy group-containing compound (p1) is preferred to contain glycidyl (meth)acrylate, which is widely used and easily obtained.

The epoxy group-free compound (p2) may be any compound as long as it is polymerizable with the epoxy group-containing compound (p1). The epoxy group-free compound (p2) may contain one or more kinds of compounds selected from a group consisting of, for example, 2-(meth)acryloyloxyethyl phthalate, 2-(meth)acryloyloxyethyl-2-hydroxyethyl phthalate, 2-(meth)acryloyloxypropyl phthalate, benzyl (meth)acrylate, neopentyl glycol benzoate (meth)acrylate, paracumyl phenoxyethylene glycol (meth)acrylate, EO-modified cresol (meth)acrylate, ethoxylated phenyl (meth)acrylate, nonylphenoxy polyethylene glycol (meth)acrylate (polymerization degree n=2–17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth) acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, vinylcarbazole, styrene, N-phenylmaleimide, N-benzylmaleimide, N-succinimidyl 3-maleimidobenzoate, straight or branched aliphatic (meth)acrylic acid esters or alicyclic (meth)acrylic acid esters (which may contain unsaturated bonding partially in a carbon ring), hydroxyalkyl (meth)acrylates, alkoxyalkyl (meth)acrylates, and N-substituted maleimides (for example, N-cyclohexylmaleimide).

The epoxy group-free compound (p2) may further contain a compound which contains two or more ethylene-based unsaturated groups per molecule. When this compound is used and an amount thereof is adjusted, hardness and oiliness of the solder resist layer can be easily adjusted. The compound which contains two or more ethylene-based unsaturated groups per molecule may contain one or more kinds of compounds selected from a group consisting of, for example, polyethylene glycol di(meth)acrylate, polypropylene glycol di(meth)acrylate, trimethylolpropane tri(meth)acrylate, and pentaerythritol tri(meth)acrylate.

The ethylene-based unsaturated compound (p) is polymerized to obtain polymers by a known polymerization method such as, for example, solution polymerization and emulsion polymerization. Examples of the solution polymerization include: a method in which the ethylene-based unsaturated compound (p) is heated and stirred in presence of a polymerization initiator in an appropriate organic solvent under a nitrogen atmosphere; and azeotropic polymerization.

The organic solvent used for polymerization of the ethylene-based unsaturated compound (p) may contain one or more kinds of compounds selected from a group consisting of: for example, ketones such as methyl ethyl ketone and cyclohexanone; aromatic hydrocarbons such as toluene and xylene; acetic esters such as ethyl acetate, butyl acetate, cellosolve acetate, butyl cellosolve acetate, carbitol acetate, butyl carbitol acetate, and propylene glycol monomethylether acetate; and dialkyl glycol ethers.

The polymerization initiator used for polymerization of the ethylene-based unsaturated compound (p) may contain one or more kinds of compounds selected from a group consisting of, for example, hydroperoxides such as diisopropylbenzene hydroperoxide, dialkyl peroxides such as dicumyl peroxide and 2,5-dimethyl-2,5-di-(t-butylperoxy)-hexane, diacyl peroxides such as isobutyryl peroxide, ketone peroxides such as methyl ethyl ketone peroxide, alkyl peresters such as t-butyl peroxypivalate, peroxydicarbonates such as diisopropyl peroxydicarbonate, azo compounds such as azobisisobutyronitrile, and redox type initiators.

The ethylene-based unsaturated compound (a2) may contain a compound selected from a group consisting of appropriate polymers and prepolymers. The ethylene-based unsaturated compound (a2) may contain a compound which contains only one ethylene-based unsaturated group. The compound which contains only one ethylene-based unsaturated group may contain one or more kinds of compounds selected from a group consisting of, for example, acrylic acid, methacrylic acid, crotonic acid, cinnamic acid, 2-acryloyloxyethyl succinic acid, 2-methacryloyloxyethyl succinic acid, 2-acryloyloxyethyl phthalic acid, 2-methacryloyloxyethyl phthalic acid, β-carboxyethyl acrylate, 2-acryloyloxypropyl phthalic acid, 2-methacryloyloxypropyl phthalic acid, 2-acryloyloxyethyl maleic acid, 2-methacryloyloxyethyl maleic acid, 2-acryloyloxyethyl tetrahydrophthalic acid, 2-methacryloyloxyethyl tetrahydrophthalic acid, 2-acryloyloxyethyl hexahydrophthalic acid, and 2-methacryloyloxyethyl hexahydrophthalic acid. The ethylene-based unsaturated compound (a2) may further contain a compound which contains multiple ethylene-based unsaturated groups. The compound which contains multiple ethylene-based unsaturated groups may contain one or more kinds of compounds selected from a group consisting of compounds which are obtained by reacting a dibasic acid anhydride with a polyfunctional acrylate or a polyfunctional methacrylate which contains a hydroxyl group such as, for example, pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate.

The ethylene-based unsaturated compound (a2) is especially preferred to contain at least one of acrylic acid and methacrylic acid. In this case, since an ethylene-based unsaturated group derived from acrylic acid and methacrylic acid has especially excellent photoreactivity, the first resin (a) can gain high photoreactivity.

An amount of the ethylene-based unsaturated compound (a2) used is preferably adjusted so that an amount of carboxyl groups in the ethylene-based unsaturated compound (a2) is within a range of 0.4 to 1.2 mol per 1 mol of epoxy groups in the epoxy compound (a1), and especially preferably adjusted so that the amount of carboxyl groups in the ethylene-based unsaturated compound (a2) is within a range of 0.5 to 1.1 mol per 1 mol of epoxy groups in the epoxy compound (a1).

The compound (a3) selected from polycarboxylic acids and anhydrides thereof may contain one or more kinds of compounds selected from a group consisting of: for example, dicarboxylic acids such as phthalic acid, tetrahydrophthalic acid, methyltetrahydrophthalic acid, methylnadic acid, hexahydrophthalic acid, methylhexahydrophthalic acid, succinic acid, methylsuccinic acid, maleic acid, citraconic acid, glutaric acid, and itaconic acid; polycarboxylic acids of tri or higher basic acids such as cyclohexane-1,2,4-tricarboxylic acid, trimellitic acid, pyromellitic acid, benzophenonetetracarboxylic acid, and methylcyclohexenetetracarboxylic acid; and anhydrides thereof.

The compound (a3) is used mainly for providing the first resin (a) with an acid value and thereby supplying the solder resist composition with redispersibility and resolubility in a dilute aqueous alkaline solution. An amount of the compound (a3) used is adjusted so that an acid value of the first resin (a) is preferably greater than or equal to 30 mgKOH/g and especially preferably greater than or equal to 60 mgKOH/g. Furthermore, the amount of the compound (a3) used is adjusted so that an acid value of the first resin (a) is preferably less than or equal to 160 mgKOH/g and especially preferably less than or equal to 130 mgKOH/g.

In synthesis of the first resin (a), a known method can be employed to promote an addition reaction between the epoxy compound (a1) and the ethylene-based unsaturated compound (a2) and a subsequent addition reaction between a product thereof (a product of the preceding addition reaction) and the compound (a3). For example, in the addition reaction between the epoxy compound (a1) and the ethylene-based unsaturated compound (a2), the ethylene-based unsaturated compound (a2) is added to a solvent solution of the epoxy compound (a1), then if necessary a heat polymerization inhibitor and a catalyst are added, and the mixture is stirred and mixed to obtain a reactive solution. The reactive solution undergoes the addition reaction using an ordinary method at a reaction temperature of preferably 60 to 150° C. and especially preferably 80 to 120° C., and the product of the preceding addition reaction is obtained. Examples of the heat polymerization inhibitor may include hydroquinone and hydroquinone monomethyl ether. Examples of the catalyst may include tertiary amines such as benzyldimethylamine and triethylamine, quaternary ammonium salts such as trimethylbenzylammonium chloride and methyltriethylammonium chloride, triphenylphosphine, and triphenylstibine.

In order to promote the subsequent addition reaction between the product of the preceding addition reaction and the compound (a3), the compound (a3) is added to a solvent solution of the product of the preceding addition reaction, then if necessary a heat polymerization inhibitor and a catalyst are added, and the mixture is stirred and mixed to obtain a reactive solution. The reactive solution undergoes the addition reaction using an ordinary method, and the first resin (a) is obtained. Reaction conditions may be same as the reaction conditions of the preceding addition reaction between the epoxy compound (a1) and the ethylene-based unsaturated compound (a2). The heat polymerization inhibitor and the catalyst used for the preceding addition reaction between the epoxy compound (a1) and the ethylene-based unsaturated compound (a2) which contains a carboxyl group may be used.

The component (A2) may contain carboxyl group-containing (meth)acrylic copolymer resin (referred to as second resin (b)) obtained from a reaction between a part of carboxyl groups in a polymer of an ethylene-based unsaturated monomer including an ethylene-based unsaturated compound which contains a carboxyl group, and an ethylene-based unsaturated compound which contains an epoxy group. The ethylene-based unsaturated monomer may include an ethylene-based unsaturated compound which does not contain any carboxyl groups, if necessary.

The second resin (b) may contain aromatic ring-containing (meth)acrylic copolymer resin. That is, the component (A) may contain the aromatic ring-containing (meth)acrylic copolymer resin. In this case, heat resistance of the solder resist layer is especially increased. Note that the aromatic ring-containing (meth)acrylic copolymer resin is defined as (meth)acrylic copolymer resin which contains an aromatic ring. When the ethylene-based unsaturated monomer includes a compound which contains an aromatic ring, the aromatic ring-containing (meth)acrylic copolymer resin is obtained.

The ethylene-based unsaturated compound which contains a carboxyl group used to obtain the second resin (b) may contain appropriate polymers and prepolymers. For example, the ethylene-based unsaturated compound which contains a carboxyl group may contain a compound which contains only one ethylene-based unsaturated group. More specifically, the ethylene-based unsaturated compound which contains a carboxyl group may contain one or more kinds of compounds selected from a group consisting of, for example, acrylic acid, methacrylic acid, ω-carboxyl-polycaprolactone (n≈2) monoacrylate, crotonic acid, cinnamic acid, 2-acryloyloxyethyl succinic acid, 2-methacryloyloxyethyl succinic acid, 2-acryloyloxyethyl phthalic acid, 2-methacryloyloxyethyl phthalic acid, β-carboxyethylacrylate, 2-acryloyloxypropyl phthalic acid, 2-methacryloyloxypropyl phthalic acid, 2-acryloyloxyethyl maleic acid, 2-methacryloyloxyethyl maleic acid, 2-acryloyloxyethyl tetrahydrophthalic acid, 2-methacryloyloxyethyl tetrahydrophthalic acid, 2-acryloyloxyethyl hexahydrophthalic acid, and 2-methacryloyloxyethyl hexahydrophthalic acid. The ethylene-based unsaturated compound which contains a carboxyl group may also contain a compound which contains multiple ethylene-based unsaturated groups. More specifically, for example, the ethylene-based unsaturated compound which contains a carboxyl group may contain a compound obtained by reacting a dibasic acid anhydride with a polyfunctional (meth)acrylate which contains a hydroxyl group selected from a group consisting of pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate. These compounds may be used alone or in combination.

The ethylene-based unsaturated compound which does not contain any carboxyl groups used to obtain the second resin (b) may be any compound as long as it is copolymerizable with the ethylene-based unsaturated compound which contains a carboxyl group. The ethylene-based unsaturated compound which does not contain any carboxyl groups may contain either one of an aromatic ring-containing compound and an aromatic ring-free compound. When the ethylene-based unsaturated compound which does not contain any carboxyl groups contains the aromatic ring-containing compound, aromatic ring-containing (meth)acrylic copolymer resin is obtained.

The aromatic ring-containing compound may contain one or more kinds of compounds selected from a group consisting of, for example, 2-(meth)acryloyloxyethyl-2-hydroxyethyl phthalate, benzyl (meth)acrylate, neopentyl glycol benzoate (meth)acrylate, paracumyl phenoxyethylene glycol (meth)acrylate, EO-modified cresol (meth)acrylate, ethoxylated phenyl (meth)acrylate, nonylphenoxy polyethylene glycol (meth)acrylate (n=2 to 17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth) acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, N-phenylmaleimide, N-benzylmaleimide, N-vinylcarbazole, styrene, vinylnaphthalene, and 4-vinylbiphenyl.

The aromatic ring-free compound may contain one or more kinds of compounds selected from a group consisting of: for example, straight or branched aliphatic (meth)acrylic acid esters or alicyclic (meth)acrylic acid esters (which may contain unsaturated bonding partially in a carbon ring); hydroxyalkyl (meth)acrylates; alkoxyalkyl (meth)acrylates; and N-substituted maleimides such as N-cyclohexylmaleimide. The aromatic ring-free compound may further contain a compound which contains two or more ethylene-based unsaturated groups per molecule, such as polyethylene glycol di(meth)acrylate, polypropylene glycol di(meth)acrylate, trimethylolpropane tri(meth)acrylate, and pentaerythritol tri(meth)acrylate. These compounds may be used alone or in combination. These compounds are preferred since hardness and oiliness of the solder resist layer can be easily adjusted.

Examples of the ethylene-based unsaturated compound which contains an epoxy group used to obtain the second resin (b) may include appropriate polymers and prepolymers. Specific examples of the ethylene-based unsaturated compound which contains an epoxy group may include epoxycyclohexyl derivatives of acrylic acids or methacrylic acids, alicyclic epoxy derivatives of acrylates or methacrylates, β-methylglycidyl acrylate, and β-methylglycidyl methacrylate. These compounds may be used alone or in combination. Especially, it is preferred to use glycidyl (meth)acrylate, which is widely used and easily obtained.

The component (A2) may contain resin (hereinafter referred to as third resin (C)) obtained by adding a compound which contains an ethylene-based unsaturated group and an isocyanate group to a part or all of hydroxyl groups in a polymer of an ethylene-based unsaturated monomer including: an ethylene-based unsaturated compound which contains a carboxyl group; and an ethylene-based unsaturated compound which contains an epoxy group. The ethylene-based unsaturated monomer may include an ethylene-based unsaturated compound which does not contain any carboxyl groups or hydroxyl groups, if necessary.

The ethylene-based unsaturated compound which contains a carboxyl group used to obtain the third resin (c) may be selected from, for example, compounds which can be used as the ethylene-based unsaturated compound which contains a carboxyl group used to obtain the second resin (b).

Examples of the ethylene-based unsaturated compound which contains a hydroxyl group used to obtain the third resin (c) may include: hydroxyalkyl (meth)acrylates such as 2-hydroxyethyl (meth)acrylate, 2-hydroxypropyl (meth) acrylate, 4-hydroxybutyl (meth) acrylate, cyclohexane dimethanol mono(meth)acrylate, 2-(meth)acryloyloxyethyl-2-hydroxyethylphthalate, caprolactone (meth)acrylate, polyethylene glycol (meth)acrylate, polypropylene glycol (meth) acrylate, trimethylolpropane di(meth)acrylate, pentaerythritol tri(meth)acrylate, and dipentaerythritol penta (meth)acrylate; hydroxybutyl vinyl ether; hydroxyethyl vinyl ether; and N-hydroxyethyl (meth)acrylamide.

Specific examples of the compound which contains an ethylene-based unsaturated group and an isocyanate group used to obtain the third resin (c) may include 2-acryloyloxy-ethyl isocyanate (for example, KarenzAOI manufactured by Showa Denko K.K.), 2-methacryloyloxyethyl isocyanate (for example, KarenzMOI manufactured by Showa Denko K.K.), methacryloyloxy ethoxyethyl isocyanate (for example, KarenzMOI-EG manufactured by Showa Denko K.K.), isocyanate blocked compound of KarenzMOI (for example, KarenzMOI-BM manufactured by Showa Denko K.K.), isocyanate blocked compound of KarenzMOI (for example, KarenzMOI-BP manufactured by Showa Denko K.K.), and 1,1-(bisacryloyloxymethyl)ethyl isocyanate (for example, KarenzBEI manufactured by Showa Denko K.K.).

A weight-average molecular weight of the entire component (A2) is preferably within a range of 800 to 100000. Within this range, the solder resist composition gains especially excellent photosensitivity and resolution.

An acid value of the entire component (A2) is preferably greater than or equal to 30 mgKOH/g. In this case, the solder resist composition gains good developability. The acid value is further preferably greater than or equal to 60 mgKOH/g. In addition, the acid value of the entire component (A2) is preferably less than or equal to 180 mgKOH/g. In this case, an amount of remaining carboxyl groups in the film formed with the solder resist composition decreases, thus good electric properties, electric corrosion resistance and water resistance of the film are maintained. The acid value is further preferably less than or equal to 150 mgKOH/g.

The component (B) (the epoxy compound) can provide the solder resist composition with thermosettability.

As described above, the component (B) contains the hydroquinone epoxy compound represented by the formula (1). The hydroquinone epoxy compound represented by the formula (1) is preferably included within 3 to 100 weight % in the entire component (B). In this case, the solder resist layer can be prevented from becoming fragile and can gain the flexibility, and at the same the solder resist layer can gain high light resistance, heat resistance and heat discoloration resistance.

The component (B) may contain a compound other than the hydroquinone epoxy compound (hereinafter referred to as a second compound) in addition to the hydroquinone epoxy compound represented by the formula (1).

The second compound preferably contains at least two epoxy groups per molecule. The epoxy compound may be a hardly soluble epoxy compound and may be a generic soluble epoxy compound.

The second compound is not particularly limited, but the second compound especially preferably contains one or more kinds of components selected from a group consisting of phenol novolak epoxy resin (for example, EPICLON N-775 manufactured by DIC Corporation), cresol novolak epoxy resin (for example, EPICLON N-695 manufactured by DIC Corporation), bisphenol A epoxy resin (for example, jER1001 manufactured by Mitsubishi Chemical Corporation), bisphenol A-novolak epoxy resin (for example, EPICLON N-865 manufactured by DIC Corporation), bisphenol F epoxy resin (for example, jER4004P manufactured by Mitsubishi Chemical Corporation), bisphenol S epoxy resin (for example, EPICLON EXA-1514 manufactured by DIC Corporation), bisphenol AD epoxy resin, biphenyl epoxy resin (for example, YX4000 manufactured by Mitsubishi Chemical Corporation), biphenyl novolak epoxy resin (for example, NC-3000 manufactured by Nippon Kayaku Co., Ltd.), hydrogenated bisphenol A epoxy resin (for example, ST-4000D manufactured by Nippon Steel & Sumikin Chemical Co., Ltd.), naphthalene epoxy resin (for example, EPICLON HP-4032, EPICLON HP-4700, EPICLON HP-4770 manufactured by DIC Corporation), hydroquinone epoxy resin, tertiary butylcatechol epoxy resin (for example, EPICLON HP-820 manufactured by DIC Corporation), dicyclopentadiene epoxy resin (for example, EPICLON HP-7200 manufactured by DIC Corporation), adamantane epoxy resin (for example, ADAMANTATE X-E-201 manufactured by Idemitsu Kosan Co., Ltd.), biphenylether epoxy resin (for example, YSLV-80DE manufactured by Nippon Steel & Sumikin Chemical Co., Ltd.), special two-functional epoxy resin (for example, YL7175-500 and YL7175-1000 manufactured by Mitsubishi Chemical Corporation; EPICLON TSR-960, EPICLON TER-601, EPICLON TSR-250-80BX, EPICLON 1650-75MPX, EPICLON EXA-4850, EPICLON EXA-4816, EPICLON EXA-4822, and EPICLON EXA-9726 manufactured by DIC Corporation; YSLV-120TE manufactured by Nippon Steel & Sumikin Chemical Co., Ltd.), and bisphenol epoxy resin excluding the above.

The second compound may contain triglycidyl isocyanurate. The triglycidyl isocyanurate is especially preferably in a form of β isomers, in which three epoxy groups are located on the same side with respect to a flat s-triazine ring, or in a mixture of β isomers and α isomers, in which one epoxy group is located on the different side from other two epoxy groups with respect to a flat s-triazine ring.

Note that, in order to especially effectively suppress discoloration of the solder resist layer as well as to effectively suppress brittleness of the solder resist layer and to provide the solder resist layer with the flexibility, the second compound preferably does not contain the triglycidyl isocyanurate, i.e., the solder resist composition preferably does not contain the triglycidyl isocyanurate.

The second compound also preferably contains phosphorus-containing epoxy resin. In this case, flame retardancy of the cured product of the solder resist composition is improved. Examples of the phosphorus-containing epoxy resin may include phosphoric acid-modified bisphenol F epoxy resin (for example, EPICLON EXA-9726 and EPICLON EXA-9710 manufactured by DIC Corporation) and Epotohto FX-305 manufactured by Nippon Steel & Sumikin Chemical Co., Ltd.

The component (C) (the titanium dioxide) colors the solder resist layer formed with the solder resist composition white, and accordingly the solder resist layer can gain high light reflectivity. The component (C) may contain, for example, either one or both of rutile titanium dioxide and anatase titanium dioxide. Especially, the titanium dioxide preferably contains the rutile titanium dioxide which has low catalyst activity and high thermal stability. The rutile titanium dioxide is manufactured industrially by a chlorine method or a sulfuric acid method. In the present embodiment, the rutile titanium dioxide may contain either one or both of rutile titanium dioxide manufactured by a chlorine method and rutile titanium dioxide manufactured by a sulfuric acid method.

In the present embodiment, as described above, the component (D) (the photopolymerization initiator) contains (D1) the bisacylphosphine oxide-containing photopolymerization initiator and (D2) the α-hydroxy alkylphenone-based photopolymerization initiator.

The component (D) (the bisacylphosphine oxide-containing photopolymerization initiator) may contain one or more kinds of compounds selected from a group consisting of, for example, bis-(2,6-dichlorobenzoyl)phenylphosphine oxide, bis-(2,6-dichlorobenzoyl)-2,5-dimethylphenylphosphine oxide, bis-(2,6-dichlorobenzoyl)-4-propylphylphosphine oxide, bis-(2,6-dichlorobenzoyl)-1naphthylphosphine oxide, bis-(2,6-dimethoxybenzoyl)phenylphosphine oxide, bis-(2,6-dimethoxybenzoyl)-2,4,4-trimethylpentylphosphine oxide, bis-(2,6-dimethoxybenzoyl)-2,5-dimethylphenylphosphine oxide, and bis-(2,4,6-trimethylbenzoyl)phenylphosphine oxide. Especially, the component (D1) preferably contains bis-(2,4,6-trimethylbenzoyl)phenylphosphine oxide. It is also preferable that the component (D1) contains bis-(2,4,6-trimethylbenzoyl)phenylphosphine oxide only. In these cases, coloring of the solder resist layer is further prevented.

The component (D2) (the α-hydroxyalkylphenone-based photopolymerization initiator) contains, for example, at least one of an α-hydroxy alkylphenone and an alkyl ester of an α-hydroxy alkylphenone. More specifically, the component (D2) may contain at least one kind of compound selected from a group consisting of, for example,
2-hydroxy-2-methyl-1-phenyl-propane-1-one, 1-hydroxy cyclohexyl phenyl ketone, 1-[4-(2-hydroxy ethoxy)-phenyl]-2-hydroxy-2-methyl-1-propane-1-one, and 2-hydroxy-1-{4-[4-(2-hydrox-2-methyl-propyonyl)-benzyl]phenyl}-2-methyl-propane-1-one.

The component (D) preferably contains only the component (D1) and the component (D2). However, in addition to the component (D1) and the component (D2), the component (D) may contain, within the scope of the present invention, one or more kinds of compounds selected from a group consisting of: for example, benzoins and alkylethers thereof; acetophenones such as acetophenone and benzyldimethyl ketal; anthraquinones such as 2-methylanthraquinone; thioxanthones such as 2,4-dimethylthioxanthone, 2,4-diethylthioxanthone, 2-isopropylthioxanthone, 4-isopropylthioxanthone, and 2,4-diisopropylxanthone; benzophenones such as benzophenone and 4-benzoyl-4'-methyl-diphenylsulfide; xanthones such as 2,4-diisopropylxanthone; nitrogen atom-containing compounds such as 2-methyl-1-[4-(methylthio)phenyl]-2-morpholino-1-propanone; monoacylphosphine oxide-containing photopolymerization initiators such as 2,4,6-trimethylbenzoyl-diphenyl-phosphne oxide (DAROCUR TPO) and 2,4,6-trimethylbenzoyl-ethyl-phenyl-phosphinate (SPEEDCURE TPO-L); 1,2-octanedione; 1-[4-(phenylthio)-2-(O-benzoyloxyme)] (IRGACURE OXE 01); ethanone; and 1-[9-ethyl-6-(2-methylbenzoyl)-9H-carbazole-3-yl]-1-(O-acetyloxime) (IRGACURE OXE 02).

Note that the component (D) preferably does not contain the monoacylphosphine oxide such as the 2,4,6-trimethvl-benzoyl -diphenyl-phosphine oxide. When the component (D) contains the component (D1) and the component (D2), the monoacylphosphine oxide inhibits curability of the deep part of the solder resist layer. Therefore, when the component (D) does not contain the monoacylphosphine oxide, the curability of the deep part of the solder resist layer becomes especially high.

In the entire component (D), the component (D1) and the component (D2) are included preferably within a range of 5 to 100 weight % in total. In this case, the solder resist layer has especially high photocurability. The component (D1) and the component (D2) are included more preferably within a range of 7 to 100 weight % in total, further preferably within a range of 9 to 100 weight %, and especially preferably within a range of 70 to 100 weight %

In addition, in the entire component (D1) and component (D2), the component (D1) is included preferably within a range of 1 to 99 weight %. In this case, the solder resist layer can be thoroughly and highly uniformly cured from its surface to its deep part. The component (D1) is included more preferably within a range of 5 to 60 weight % and further preferably within a range of 10 to 40 weight %

The solder resist composition may further contain a known photopolymerization promotor and a known sensitizer. The solder resist composition may contain, for example, p-dimethylbenzoic acid ethylester, p-dimethylaminobenzoic acid isoamyl ester, and 2-dimethylaminoethyl benzoate.

As mentioned above, the component (E) (the antioxidant) contributes to curing of the solder resist layer from its surface to its deep part and further to an improvement in adhesiveness as well as to an improvement in heat discoloration resistance of the solder resist layer.

A melting point of the component (E) is preferably within a range of 50 to 150° C. With the melting point higher than or equal to 50° C., bleedout of the component (E) from the solder resist composition or the film can be prevented, when the solder resist composition is dried by heating or the film formed with the solder resist composition is cured by heating. Also, with the melting point lower than or equal to 150° C., crystals of the component (E) is prevented from rising to a surface of the coating film formed with the solder resist composition, resulting in prevention of lowered uniformity on a surface of the solder resist layer.

The component (E) may contain at least one kind of compound selected from a group consisting of, for example, hindered phenolic antioxidants such as: IRGANOX 245 (melting point of 76 to 79° C.), IRGANOX 259 (melting point of 104 to 108° C.), IRGANOX 1035 (melting point of 63 to 67° C.), IRGANOX 1098 (melting point of 156 to 161° C.), IRGANOX 1010 (melting point of 110 to 125° C.), IRGANOX 1076 (melting point of 50 to 55° C.), and IRGANOX 1330 (melting point of 240 to 245° C.) manufactured by BASF Corporation; ADEKA STAB AO-20 (melting point of 220 to 222° C.), ADEKA STAB AO-30 (melting point of 183 to 185° C.), ADEKA STAB AO-40

(melting point of 210 to 214° C.), ADEKA STAB AO-50 (melting point of 51 to 54° C.), ADEKA STAB AO-60 (110 to 130° C.), ADEKA STAB AO-80 (110 to 120° C.), and ADEKA STAB AO-330 (melting point of 243 to 245° C.) manufactured by ADEKA CORPORATION; SEENOX224M (melting point of 129 to 132° C.) and SEENOX326M (melting point of 241 to 249° C.) manufactured by SHIPRO KASEI KAISHA, Ltd.; SUMILIZER GA-80 (melting point of higher than or equal to 110° C.) and SUMILIZER MDP-S (melting point of higher than or equal to 128° C.) manufactured by Sumitomo Chemical CO., Ltd.; and Antage BHT (melting point of higher than or equal to 69° C.), Antage W-300 (melting point of higher than or equal to 205° C.), Antage W-400 (melting point of higher than or equal to 120° C.), and Antage W-500 (melting point of higher than or equal to 120° C.) manufactured by Kawaguchi Chemical Industry Co., LTD. Especially, the component (E) preferably contains IRGANOX 1010 (melting point of 110 to 125° C.).

The solder resist composition may contain (F) a photopolymerizable compound. The component (F) provides photocurability to the solder resist composition. The photopolymerizable compound contains one or more kinds of compounds selected from a group consisting of photopolymerizable monomers and photopolymerizable prepolymers.

The photopolymerizable monomer contains, for example, an ethylene-based unsaturated group. The photopolymerizable monomer may contain one or more kinds of compounds selected from a group consisting of: for example, monofunctional (meth)acrylates such as 2-hydroxyethyl (meth) acrylate; and polyfunctional (meth)acrylates such as diethylene glycol di(meth)acrylate, trimethylolpropane di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, and ε-caprolactone-modified dipentaerythritol hexaacrylate.

The photopolymerizable monomer preferably contains a phosphorus-containing compound (a phosphorus-containing photopolymerizable compound). In this case, flame retardancy of the cured product of the solder resist composition is improved. The phosphorus-containing photopolymerizable compound may contain one or more kinds of compounds selected from a group consisting of, for example, 2-methacryloyloxy ethyl acid phosphate (for example, Light Ester P-1M and Light Ester P-2M manufactured by Kyoeisha Chemical Co., Ltd.), 2-acryloyloxy ethyl acid phosphate (for example, Light Acrylate P-1A manufactured by Kyoeisha Chemical Co., Ltd.), diphenyl-2-methacryloyloxy ethyl phosphate (for example, MR-260 manufactured by Daihachi Chemical Industry Co., Ltd.), and HFA series manufactured by Showa Highpolymer K. K. (for example, HFA-6003 and HFA-6007 which are products of an addition reaction of dipentaerythritol hexaacrylate and HCA, and HFA-3003 and HFA 6127 which are products of an addition reaction of caprolactone-modified dipentaerythritol hexaacrylate and HCA).

Examples of the photopolymerizable prepolymer may include: a prepolymer which is prepared by adding an ethylene-based unsaturated group to a prepolymer obtained by polymerization of photopolymerizable monomers; and oligo (meth)acrylate prepolymers such as epoxy (meth)acrylates, polyester (meth)acrylates, urethane (meth)acrylates, alkyd resin (meth)acrylates, silicone resin (meth)acrylates, and spiran resin (meth)acrylates.

The component (F) is especially preferred to contain a caprolactone-modified (meth) acrylate monomer such as ε-caprolactone-modified dipentaerythritol hexaacrylate (for example, KAYARAD DPCA-20, DPCA-40, DPCA-60, and DPCA-120 manufactured by Nippon Kayaku Co., Ltd.) and ε-caprolactone-modified tris-(2-acryloxyethyl) isocyanurate (for example, NK Ester A-9300-1CL manufactured by Shin-Nakamura Chemical Co., Ltd.). In this case, the solder resist layer is particularly effectively prevented from becoming fragile.

The solder resist composition may contain an organic solvent. The organic solvent is used to liquefy the solder resist composition or form varnish with the solder resist composition, and to adjust viscosity, applicability, and film-formability.

The organic solvent may contain one or more kinds of compounds selected from a group consisting of: for example, straight, branched, secondary, or poly alcohols such as ethanol, propyl alcohol, isopropyl alcohol, hexanol, and ethylene glycol; ketones such as methyl ethyl ketone and cyclohexanone; aromatic hydrocarbons such as toluene and xylene; petroleum aromatic mixed solvents such as Swazol series (manufactured by Maruzen Petrochemical Co., Ltd.) and Solvesso series (manufactured by Exxon Mobil Chemical Corporation); cellosolves such as cellosolve and butyl cellosolve; carbitols such as carbitol and butyl carbitol; propylene glycol alkyl ethers such as propylene glycol methyl ether; polypropylene glycol alkyl ethers such as dipropylene glycol methyl ether; acetic acid esters such as ethyl acetate, butyl acetate, cellosolve acetate, and carbitol acetate; and dialkyl glycol ethers.

An amount of the organic solvent in the solder resist composition is preferably adjusted so that the organic solvent volatilizes quickly when a coating film formed with the solder resist composition is dried, i.e. the organic solvent does not remain in the dried coating film. Especially, the amount of the organic solvent in the entire solder resist composition is preferably within a range of 0 to 99.5 weight %, and further preferably within a range of 15 to 60 weight %. Note that, since an appropriate amount of the organic solvent depends on a coating method, the amount is preferably adjusted appropriately depending on the coating method.

Within the scope of the present invention, the solder resist composition may include components other than the above.

For example, the solder resist composition may contain one or more kinds of resin selected from a group consisting of: blocked isocyanates of tolylene diisocyanate, morpholine diisocyanate, isophorone diisocyanate, and hexamethylene diisocyanate which are blocked with caprolactam, oxime, maleic acid ester, and the like; amino resin such as melamine resin, n-butylated melamine resin, isobutylated melamine resin, butylated urea resin, butylated melamine-urea co-condensed resin, and benzoguanamine-based co-condensed resin; various thermosetting resin other than the above; photocuring epoxy (meth)acrylate; resin obtained by adding (meth)acrylic acid to epoxy resin such as bisphenol A type epoxy resin, phenol novolak type epoxy resin, cresol novolak type epoxy resin, and alicyclic epoxy resin; and polymeric compounds such as diallyl phthalate resin, phenoxy resin, urethane resin, and fluorine resin.

When the solder resist composition contains the epoxy compound, the solder resist composition may further contain a curing agent to cure the epoxy compound. The curing agent may contain one or more kinds of compounds selected from a group consisting of: for example, imidazole derivatives such as imidazole, 2-methylimidazole, 2-ethylimidazole, 2-ethyl-4-methylimidazole, 2-phenylimidazole, 4-phenyl-imidazole, 1-cyanoethyl-2-phenylimidazole, and 1-(2- cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid hydrazide and sebacic acid hydrazide; phosphorus compounds such as triphenylphosphine; acid anhydrides; phenols; mercaptans; Lewis acid amine complexes; and onium salts. Examples of commercial products of the above compounds may include 2MZ-A, 2MZ-OK, 2PHZ, 2P4BHZ, and 2P4MHZ manufacture by Shikoku Chemicals Corporation (product names for commercial products of imidazole compounds), U-CAT3503N and U-CAT3502T manufactured by San-Apro Ltd. (product names for commercial products of blocked isocyanates of dimethylamine), and DBU, DBN, U-CATSA102, and U-CAT5002 manufactured by San-Apro Ltd. (bicyclic diamine compounds and salts thereof).

The solder resist composition may contain an adhesiveness-imparting agent. Examples of the adhesiveness-imparting agent may include guanamine, acetoguanamine, benzoguanamine, melamine, and S-triazine derivatives such as 2,4-diamino-6-methacryloyloxyethyl-S-triazine, 2-vinyl-4,6-diamino-S-triazine, 2-vinyl-4,6-diamino-S-triazine-isocyanuric acid adduct, and 2,4-diamino-6-methacryloyloxyethyl-S-triazine-isocyanuric acid adduct.

The solder resist composition may contain one or more kinds of compounds selected from a group consisting of: a curing promotor; a coloring agent other than white; a copolymer such as silicones and acrylates; a leveling agent; an adhesiveness-imparting agent such as silane coupling agents; a thixotropy agent; a polymerization inhibitor; a halation preventer; a flame retardant; a defoaming agent; a surfactant; a polymer dispersant; and an inorganic filler such as barium sulfate, crystalline silica, nano silica, carbon nanotube, talc, bentonite, aluminum hydroxide, and magnesium hydroxide.

An amount of each component in the solder resist composition is appropriately adjusted so that the solder resist composition has photocurability and is developable with an alkaline aqueous solution.

In the solder resist composition, the amount of the component (A) is preferably within a range of 5 to 85 weight %, more preferably within a range of 10 to 75 weight %, and further preferably within a range of 10 to 40 weight %, with respect to solid content of the solder resist composition.

In the solder resist composition, the amount of the component (B) is preferably within a range of 1.5 to 85 weight %, more preferably within a range of 1.5 to 60 weight %, and further preferably within a range of 2 to 40 weight %, with respect to the solid content of the solder resist composition.

In the solder resist composition, the amount of the component (C) is preferably within a range of 15 to 500 parts by mass, with respect to 100 parts by mass of the carboxyl group-containing resin. Furthermore, in the solder resist composition, the amount of the titanium dioxide is preferably within a range of 3 to 220 weight % and further preferable within a range of 10 to 180 weight %, with respect to resin content of the solder resist composition.

In the solder resist composition, the amount of the component (D) is preferably within a range of 0.1 to 30 weight % and further preferably within a range of 1 to 28 weight %, with respect to the solid content of the solder resist composition.

In the solder resist composition, the amount of the component (E) is preferably within a range of 0.005 to 15 weight % and further preferably within a range of 0.05 to 10 weight %, with respect to the solid content of the solder resist composition.

In the solder resist composition, the amount of the component (F) is preferably within a range of 1 to 45 weight %, more preferably within a range of 2 to 40 weight %, and further preferably within a range of 5 to 30 weight %, with respect to the solid content of the solder resist composition.

Note that, the solid content of the solder resist composition is defined as a total amount of all components included in the solder resist composition except for components such as solvents which volatilize in formation of the solder resist layer from the solder resist composition. In addition, the resin content of the solder resist composition is defined as a total amount of the carboxyl group-containing resin, the photopolymerizable compound, and the thermosetting component included in the solder resist composition.

Ingredients as described above for the solder resist composition are combined and kneaded by a known kneading method using, for example, a three-roll, a ball mill, or a sand mill to obtain the solder resist composition.

In regard to preservation stability of the solder resist composition, some of the ingredients of the solder resist composition may be mixed to obtain a first mixture, and the rest of the ingredients may be mixed to obtain a second mixture. That is, the solder resist composition may include the first mixture and the second mixture. For example, the photopolymerizable compounds, some of the organic solvents, and the thermosetting component out of all the ingredients may be mixed and dispersed in advance to obtain the first mixture, and the rest of the ingredients may be mixed and dispersed to obtain the second mixture. In this case, required amounts of the first mixture and the second mixture may be mixed to obtain a mixture which is used to form the solder resist layer.

The solder resist composition according to the present embodiment is used, for example, to form a solder resist layer on a printed wiring board.

Described below is an example of a method to form the solder resist layer on the printed wiring board using the solder resist composition according to the present embodiment. In this example, a solder resist layer is formed with a solder resist composition which has the photocurability and the thermosettability.

First, a printed wiring board is prepared, and a coating film of the solder resist composition is formed on the printed wiring board. For example, a surface of the printed wiring board is coated with the solder resist composition to form the coating film in a wet state (wet coating film). A coating method to coat the printed wiring board with the solder resist composition is selected from a group consisting of known methods such as, for example, a dipping method, a spray method, a spin coating method, a roll coating method, a curtain coating method, and a screen printing method. Subsequently, if necessary, in order for the organic solvent in the solder resist composition to volatilize, the wet coating film is dried at a temperature, for example, within a range of 60 to 120° C. to obtain the coating film after drying (dry coating film). In the present embodiment, tackiness of the dry coating film is suppressed since the photopolymerization initiator includes three specific kinds of components as described above.

Note that, in formation of the coating film on the printed wiring board, the solder resist composition may be applied to an appropriate supporting body and dried to form the dry coating film in advance. The dry coating film may be then stacked on the printed wiring board, and pressure is applied to the dry coating film and the printed wiring board to form the dry coating film on the printed wiring board (a dry film method).

Subsequently, a negative mask is placed either directly or indirectly on the dry coating film on the printed wiring board and then the active energy rays are irradiated to the negative mask so that the coating film is exposed to light through the negative mask. The negative mask includes an exposed part, which transmits the active energy rays, and an unexposed part, which does not transmit the active energy rays. The exposed part of the negative mask has a shape corresponding to a pattern shape of the solder resist layer. For example, photo tools such as a mask film and a dry plate are used as the negative mask. Light for exposure is selected depending on composition of the solder resist composition, and ultraviolet rays are used in the present embodiment. A light source for ultraviolet rays is selected from a group consisting of, for example, a chemical lamp, a low pressure mercury lamp, a medium pressure mercury lamp, a high pressure mercury lamp, an ultra-high pressure mercury lamp, a xenon lamp, a LED, and a metal halide lamp.

Note that a method which does not use a negative mask may be employed as an exposure method. For example, a direct drawing method such as laser exposure may be employed. An appropriate printing method such as a screen printing method, an offset printing method, and an ink jet printing method may also be used for application of the solder resist composition to form an appropriately patterned coating film which is then exposed to light.

In the present embodiment, when the dry coating film is exposed to ultraviolet rays, a photocuring reaction proceeds efficiently in the dry coating film from its surface part to its deep part, as described above.

After the dry coating film is exposed to light, the negative mask is removed from the printed wiring board and then the dry coating film undergoes a development process to remove the unexposed part of the dry coating film. Accordingly, the exposed part of the dry coating film remains as the solder resist layer on a first surface and a second surface of the printed wiring board.

In the development process, an appropriate developer depending on the composition of the solder resist composition may be used. Examples of the developer may include alkaline solutions such as aqueous solutions of sodium carbonate, potassium carbonate, ammonium carbonate, sodium hydrogen carbonate, potassium hydrogen carbonate, ammonium hydrogen carbonate, sodium hydroxide, potassium hydroxide, ammonium hydroxide, tetramethylammonium hydroxide, and lithium hydroxide. Organic amines such as monoethanol amine, diethanol amine, triethanol amine, monoisopropanol amine, diisopropanol amine, and triisopropanol amine may be used as the developer. Above described developers may be used alone or in combination. When the developer is the alkaline solution, a solvent of the alkaline solution may be water alone or may be a mixture of water and a hydrophilic organic solvent such as lower alcohols.

When the solder resist composition contains the thermosetting component, the solder resist layer may be thermosetted with heating treatment, if necessary. As for conditions of the heating treatment, for example, a heating temperature is within a range of 120 to 180° C. and a heating period is within a range of 30 to 90 minutes. Accordingly, properties of the solder resist layer, such as strength, hardness, and chemical resistance, are improved.

Furthermore, after the solder resist layer undergoes the heating treatment, the solder resist layer may be irradiated with ultraviolet rays again if necessary. In this case, the photocuring reaction further proceeds in the solder resist layer. Accordingly, migration resistance of the solder resist layer is further improved.

As a result, a covered-printed wiring board which includes the printed wiring board and the solder resist layer covering the printed wiring board is obtained. In the present embodiment, the solder resist layer is cured thoroughly from its surface part to its deep part.

EXAMPLES

Hereinafter, examples of the present invention are described. Note that the present invention is not limited to following examples.

[Preparation of Carboxyl Group-Containing Resin Solution]

75 parts by mass of methacrylic acid, 85 parts by mass of methyl methacrylate, 20 parts by mass of styrene, 20 parts by mass of butyl methacrylate, 430 parts by mass of dipropylene glycol monomethyl ether, and 5 parts by mass of azobisisobutyronitrile were added to a four-neck flask equipped with a reflux condenser, a thermometer, a glass tube for nitrogen-substitution, and a stirrer. A mixture in the four-neck flask was heated at 75° C. for 5 hours under a nitrogen gas stream for a polymerization reaction to proceed, resulting in a 32% copolymer solution.

0.1 parts by mass of hydroquinone, 50 parts by mass of glycidyl methacrylate, and 0.8 parts by mass of dimethylbenzylamine were added to the copolymer solution and then the mixture was heated at 80° C. for 24 hours for an addition reaction to proceed. As a result, a 37% solution of a compound which contains a carboxyl group and an ethylene-based unsaturated group was obtained. The solution had 120 mgKOH/g of an acid value of a solid component.

[Preparations of Solder Resist Compositions]

A mixture obtained by mixing components listed in the tables below was kneaded using a three-roll to obtain a solder resist composition. Note that details of the components listed in the tables are as following.

Photopolymerization initiator (IRGACURE 819): bis(2,4,6-trimethylbenzoyl)-phenylphosphine oxide, manufactured by BASF, item No. IRGACURE 819.

Photopolymerization initiator (IRGACURE 1173): 2-hydroxy-2-methyl-1-phenyl-propane-1-one, manufactured by BASF, item No. IRGACURE 1173.

Photopolymerization initiator (IRGACURE 184): 1-hydroxy-cyclohexyl-phenyl-ketone, manufactured by BASF, item No. IRGACURE 184.

Photopolymerization initiator (IRGACURE TPO): 2,4,6-trimethylbenzoyl-diphenyl-phosphine oxide, manufactured by BASF, item No. IRGACURE TPO.

Titanium dioxide CR-90: rutile titanium dioxide manufactured by a chlorine method, manufactured by ISHIHARA SANGYO KAISHA, LTD., item No. CR-90.

Titanium dioxide R-79: rutile titanium dioxide manufactured by a sulfuric acid method, manufactured by SAKAI CHEMICAL INDUSTRY CO., LTD., item No. R-79.

Epoxy compound YDC-1312: a hydroquinone epoxy compound represented by formula (1) (2,5-di-tert-butylhydroquinone diglycidyl ether), manufactured by Nippon Steel & Sumikin Chemical Co., Ltd., item No. YDC-1312.

Epoxy compound EPICLON N-665: cresol novolak epoxy resin, manufactured by DIC Corporation, item name EPICLON N-665.

Epoxy compound YX-4000; biphenyl epoxy resin, manufactured by Mitsubishi Chemical Corporation, item No. YX-4000.

Epoxy compound TEPIC-H: triglycidyl isocyanurate, manufactured by NISSAN CHEMICAL INDUSTRIES, Ltd., item No. TEPIC-H.

Antioxidant IRGANOX 1010: hindered phenolic antioxidant, manufactured by BASF, item No. IRGANOX 1010, melting point at 115° C.

Antioxidant IRGANOX 1330: hindered phenolic antioxidant, manufactured by BASF, item No. IRGANOX 1330, melting point at 242° C.

Organic solvent: methylpropylene diglycol, manufactured by Nippon Nyukazai Co., Ltd., item No. MFDG.

Photopolymerizable monomer DPHA: dipentaerythritol hexaacrylate, manufactured by Nippon Kayaku Co., Ltd., item No. KAYARAD DPHA.

Photopolymerizable monomer DPCA-20: caprolactone-modified (meth)acrylate monomer, manufactured by Nippon Kayaku Co., Ltd., item No. KAYARAD DPCA-20.

Defoamer: manufactured by Shin-Etsu Chemical Co., Ltd., item No. KS-66.

Melamine: manufactured by NISSAN CHEMICAL INDUSTRIES, Ltd., fine-particulate melamine.

[Evaluation Tests]

(1) Preparation of Test Pieces

A glass epoxy copper-clad laminated plate including a copper foil with thickness of 35 μm was prepared. A conductor wiring was framed by etching on the glass epoxy copper-clad laminated plate to obtain a printed wiring board. A surface of the obtained printed wiring board was entirely coated with the solder resist composition by a screen printing method and thereby a coating film was formed. The coating film was dried by heating at 80° C. for 20 minutes. Thickness of the coating film after drying (dry coating film) was 20 μm. With a negative mask placed directly on the dry coating film, the negative mask was irradiated with ultraviolet rays using an exposing device equipped with a metal halide lamp, and accordingly the dry coating film was selectively exposed to light with 450 mJ/cm² of exposure. Then, the negative mask was removed from the dry coating film, and the dry coating film was developed with a sodium carbonate aqueous solution so that a part of the dry coating film, which was cured due to exposure to light, remained as a solder resist layer on the printed wiring board. The solder resist layer was further heated at 150° C. for 60 minutes and thermosetted. As a result, a test piece including the solder resist layer was obtained.

Following evaluation tests were carried out for each test piece.

(2) Evaluation of Tackiness

In preparation of each test piece, when the negative mask was removed from the dry coating film after exposure to light, peeling resistance between the dry coating film and the negative mask and a condition of the dry coating film after removal of the negative mask were observed.

The results were evaluated as follows.

A: No stickiness was observed when the dry coating film before exposure to light was touched with a finger, and no traces of the negative mask was observed on the dry coating film after removal of the negative mask succeeding to exposure to light.

B: Slight stickiness was observed when the dry coating film before exposure to light was touched with a finger, and traces of the negative mask were observed on the dry coating film after removal of the negative mask succeeding to exposure to light.

C: Conspicuous stickiness was observed when the dry coating film before exposure to light was touched with a finger, and the dry coating film was damaged after removal of the negative mask succeeding to exposure to light.

(3) Evaluation of Remained Solder Dam

A printed wiring board including a copper conductor wiring with line width of 0.2 mm, line interval of 0.3 mm, and thickness of 40 μm was prepared. A negative mask, which has a mask pattern to form solder dams with four different widths of 50 μm, 75μm, 100 μm, and 125 μm, was used. Under the same conditions as the preparation of the test pieces other than using the above printed wiring board and the above negative mask, solder dams with thickness of 40 μm were formed on the printed wiring board.

Peeling test was carried out on the solder dams using a cellophane adhesion tape, and a minimum width of the remained solder dams, which was not peeled off, on the printed wiring board was measured. It is evaluated that the smaller the minimum width is, the higher curing degree is in a deep part of the solder dams.

(4) Evaluation of Photosensitivity (Remained Steps)

A test mask for exposure to light (Step Tablet PHOTEC 21-steps manufactured by Hitachi Chemical Co., Ltd.) was directly placed and attached by low pressure adhesion on the dry coating film formed with the liquid solder resist composition of each example and comparative example. Then, the dry coating film was irradiated with ultraviolet rays with irradiation energy density of 450 mJ/cm² through the test mask, using a both-side exposing device of low pressure adhesion type manufactured by ORC Manufacturing Co., Ltd. (model No. ORC HMW680GW) equipped with a metal halide lamp. The dry coating film was then developed with a developer (a sodium carbonate aqueous solution with concertation of 1 weight %). Photosensitivity of the dry coating film was evaluated in terms of the number of remained steps.

(5) Evaluation of Plating Resistance

Each test piece was plated using a commercially available electroless nickel plating bath and a commercially available electroless gold plating bath, and plating of the each test piece was observed. Also, peeling test was carried out on the solder resist layer using a cellophane adhesion tape, and adhesiveness of the solder resist layer after plating was observed. The results were evaluated as follows.

The evaluation method is following.

A: None of change in appearance, peeling of the solder resist layer after peeling test using a cellophane adhesion tape, and intrusion of plating was observed.

B: Change in appearance and peeling of the solder resist layer after peeling test using a cellophane adhesion tape were not observed, but only slight intrusion of plating at a tip of the solder resist layer was observed.

C: Change in appearance was not observed, but peeling of the solder resist layer after peeling test using a cellophane adhesion tape was partially observed.

D: Floating of the solder resist layer and peeling of the solder resist layer after peeling test using a cellophane adhesion tape were observed.

(6) Evaluation of Crack Resistance

Each test piece was cut off with a utility knife, and then peeling test was carried out on the solder resist layer close to a cut face using a cellophane adhesion tape. The solder resist layer was observed after peeling test. The results were evaluated as follows.

A: No crack was observed in the solder resist layer, and the solder resist layer was not peeled off after peeling test using a cellophane adhesion tape.

B: Slight crack was observed in the solder resist layer, but the solder resist layer was not peeled off after peeling test using a cellophane adhesion tape.

C: Substantial crack was observed in the solder resist layer, but the solder resist layer was not peeled off after peeling test using a cellophane adhesion tape.

D: The solder resist layer was peeled off after peeling test using a cellophane adhesion tape.

(7) Evaluation of Surface Appearance

Surface appearance of the solder resist layer of each test piece was observed visually. The results were evaluated as follows.

A: No defect such as fine particles and bleeding was observed on a surface of the solder resist layer, and the surface was uniform.

B: Defect such as fine particles and bleeding was observed on a surface of the solder resist layer, or the surface was not uniform with unevenness and uneven gloss.

(8) Evaluation of Heat Crack Resistance

A printed wiring board including a copper conductor wiring with thickness of 40 μm was prepared. A solder resist layer was formed on the printed wiring board under the same conditions as the above described preparations of test pieces.

A flux was applied on the solder resist layer on the printed wiring board using LONCO 3355-11 (a water-soluble flux manufactured by London Chemical Co., Inc.). Succeedingly, the printed wiring board was dipped in a melted solder bath at 280° C. for 10 seconds and then rinsed with water, which is defined as one process. After the process was carried out 3 times, surface appearance of the solder resist layer was observed. The results were evaluated as follows.

A: No crack was observed in the solder resist layer.

B: Slight crack was observed in the solder resist layer near an interface between the solder resist layer and the conductor wiring.

C: Crack was observed clearly in the solder resist layer.

(9) Evaluation of Heat Discoloration Resistance

A b* value in L*a*b* color system was measured for the solder resist layer of each test piece right after preparation, using a spectral colorimeter manufactured by KONICA MINOLTA SENSING, INC. (model No. CM-600d). Succeedingly, each test piece was heated at 250° C. for 5 minutes and then the b* value of the solder resist layer was measured again. A value (Δb*) was calculated by subtracting the b* value of the solder resist layer before heating from the b* value of the solder resist layer after heating. The results were evaluated as follows.

A: The Δb* value was less than 2.0.

B: The Δb* value was larger than or equal to 2.0 and less than 2.5.

C: The Δb* value was larger than or equal to 2.5 and less than 3.0.

D: The Δb* value was larger than or equal to 3.0.

(10) Evaluation of Light Discoloration Resistance

A b* value in L*a*b* color system was measured for the solder resist layer of each test piece, using a spectral colorimeter manufactured by KONICA MINOLTA SENSING, INC. (model No. CM-600d). Succeedingly, the solder resist layer of each test piece was irradiated with ultraviolet rays under a condition of 50J/cm$^2$ using an exposing device equipped with a metal halide lamp, and then the b* value, in L*a*b* color system, of the solder resist layer was measured again. A value (Δb*) was calculated by subtracting the b* value of the solder resist layer before ultraviolet irradiation from the b* value of the solder resist layer after ultraviolet irradiation. The results were evaluated as follows.

A: The Δb* value was less than 2.0.

B: The Δb* value was larger than or equal to 2.0 and less than 2.5.

C: The Δb* value was larger than or equal to 2.5 and less than 3.0.

D: The Δb* value was larger than or equal to 3.0.

(11) Reflectance

A stimulus value Y expressing luminous reflectance in CIE color system was measured for the solder resist layer of each test piece. The Y value is defined as an alternative characteristic of reflectance. A spectral colorimeter manufactured by KONICA MINOLTA SENSING, INC. with model No. CM-600d was used. For standardization, a standard white surface with a known spectral reflectance factor was used.

(12) Evaluation of Adhesiveness

Conforming to a test method of JIS D0202, the solder resist layer of each test piece was cross-cut into a checker board pattern and peeling test using a cellophane adhesion tape was carried out. The solder resist layer after peeling test was observed visually. The results were evaluated as following.

A: No change was observed in all of 100 cross-cut sections.

B: Floating of the solder resist layer was observed in one of 100 cross-cut sections.

C: Peeling of the solder resist layer was observed in 2 to 10 of 100 cross-cut sections.

D: Peeling of the solder resist layer was observed in 11 to 100 of 100 cross-cut sections.

(13) Pencil Hardness

Pencil hardness of the solder resist layer of each test piece was measured using Mitsubishi Hi-Uni pencils (manufactured by Mitsubishi Pencil Co., Ltd.), conforming to JIS K5400.

TABLE 1

| | | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Composition/ parts by mass | Carboxylic group-containing resin solution (aromatic ring-containing acryl copolymer resin) | 80 | 80 | 80 | 80 | 80 | 80 | 80 | 80 | 80 | 80 | 80 |
| | Photopolymerization initiator (IRGACURE 819) | 4 | 4 | 4 | 4 | 3 | 3 | 4 | 4 | 4 | 4 | 4 |
| | Photopolymerization initiator (IRGACURE 1173) | 10 | 10 | 10 | 10 | 10 | | 10 | 10 | 10 | 10 | 10 |
| | Photopolymerization initiator (IRGACURE 184) | 6 | 6 | 6 | 6 | | 10 | 6 | 6 | 6 | 6 | 6 |
| | Photopolymerization initiator (IRGACURE TPO) | | | | | | | | | | | 7 |
| | Titanium dioxide CR-90 | 60 | | 30 | 60 | | 60 | 60 | 60 | 30 | 60 | 60 |
| | Titanium dioxide R-79 | | 60 | 30 | | 60 | | | | 30 | | |
| | Epoxy compound YDC-1312 | 15 | 15 | 15 | 15 | 15 | 15 | 15 | 12 | 11 | 15 | 15 |
| | Epoxy compound Epiclon N-665 | | | | | | | | | 2 | | |
| | Epoxy compound YX-4000 | | | | | | | | | 2 | | |
| | Antioxidant IRGANOX 1010 | 1.5 | 1.5 | 1.5 | 1.5 | 1.5 | 1.5 | 1.5 | 1.5 | 1.5 | | 1.5 |
| | Antioxidant IRGANOX 1330 | | | | | | | | | | 1.5 | |
| | Organic solvent | 10 | 10 | 10 | 10 | 10 | 10 | 10 | 10 | 10 | 10 | 10 |
| | Photopolymerizable monomer DPHA | 10 | 10 | 10 | | 10 | 10 | 5 | 10 | 5 | 10 | 10 |

TABLE 1-continued

| | | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| | Photopolymerizable monomer DPCA-20 | | | | 10 | | | 5 | | 5 | | |
| | Defoamer | 2 | 2 | 2 | 2 | 2 | 2 | 2 | 2 | 2 | 2 | 2 |
| | Melamine | 2 | 2 | 2 | 2 | 2 | 2 | 2 | 2 | 2 | 2 | 2 |
| Evaluation | Tackiness | A | A | A | A | A | A | A | A | A | A | A |
| | Remained solder dam (μm) | 50 | 50 | 50 | 75 | 75 | 75 | 75 | 50 | 75 | 50 | 75 |
| | Photosensitivity | 9 | 9 | 9 | 7 | 7 | 7 | 8 | 9 | 9 | 9 | 10 |
| | Plating resistance | A | A | A | A | B | B | B | A | B | A | B |
| | Crack resistance | B | B | B | A | B | B | A | B | B | B | B |
| | Surface appearance | A | A | A | A | A | A | A | A | A | B | A |
| | Heat crack resistance | B | B | B | A | B | B | A | B | B | B | B |
| | Heat discoloration resistance | A | A | A | A | A | A | A | A | B | A | A |
| | Light discoloration resistance | A | A | A | A | A | A | A | A | B | A | A |
| | Reflectance | 85 | 84 | 85 | 85 | 84 | 85 | 85 | 85 | 85 | 85 | 85 |
| | Adhesiveness | A | A | A | A | A | A | A | A | A | A | A |
| | Pencil hardness | 4H | 4H | 4H | 4H | 4H | 4H | 4H | 4H | 4H | 4H | 4H |

TABLE 2

| | | Comperative Examples | | | | | | | | | |
|---|---|---|---|---|---|---|---|---|---|---|---|
| | | 1 | 2 | 3 | 4 | 5 | 6 | 7 | 8 | 9 | 10 |
| Composition/ parts by mass | Carboxylic group-containing resin solution (aromatic ring-containing acryl copolymer resin) | 80 | 80 | 80 | 80 | 80 | 80 | 80 | 80 | 80 | 80 |
| | Photopolymerization initiator (IRGACURE 819) | 4 | 4 | 4 | | | 4 | 4 | 4 | 4 | 4 |
| | Photopolymerization initiator (IRGACURE 1173) | 10 | 10 | 10 | 10 | 10 | 10 | 10 | 10 | 10 | 10 |
| | Photopolymerization initiator (IRGACURE 184) | 6 | 6 | 6 | | 6 | 6 | 6 | 6 | 6 | 6 |
| | Photopolymerization initiator (IRGACURE TPO) | | | | 10 | 10 | | 10 | | | |
| | Titanium dioxide CR-90 | 60 | 60 | 60 | | 60 | 60 | 20 | 60 | 60 | 60 |
| | Titanium dioxide R-79 | | | | 60 | | | 20 | | | |
| | Epoxy compound YDC-1312 | | | | 15 | 15 | | | 15 | | |
| | Epoxy compound Epiclon N-665 | 15 | | 15 | | | 15 | 7 | | | |
| | Epoxy compound YX-4000 | | 15 | | | | | 8 | | | |
| | Epoxy compound TEPIC-H | | | | | | | | | 15 | 15 |
| | Antioxidant IRGANOX 1010 | 1.5 | 1.5 | 1.5 | | 1.5 | | 0.5 | | | 1.5 |
| | Antioxidant IRGANOX 1330 | | | | 1.5 | | 1 | | | | |
| | Organic solvent | 10 | 10 | 10 | 10 | 10 | 10 | 10 | 10 | 10 | 10 |
| | Photopolymerizable monomer DPHA | 10 | 10 | 10 | | 10 | | 5 | 10 | 10 | 10 |
| | Photopolymerizable monomer DPCA-20 | | | | 10 | | 10 | 5 | | | |
| | Defoamer | 2 | 2 | 2 | 2 | 2 | 2 | 2 | 2 | 2 | 2 |
| | Melamine | 2 | 2 | 2 | 2 | 2 | 2 | 2 | 2 | 2 | 2 |
| Evaluation | Tackiness | C | C | C | A | A | C | D | A | A | A |
| | Remained solder dam (μm) | 125 | 50 | 125 | 125 | 125 | 125 | 125 | 50 | 50 | 50 |
| | Photosensitivity | 7 | 9 | 9 | 10 | 6 | 6 | 10 | 9 | 10 | 10 |
| | Plating resistance | C | B | C | C | C | D | C | B | B | A |
| | Crack resistance | D | B | D | A | B | C | C | B | D | C |
| | Surface appearance | A | A | A | B | A | A | B | A | A | A |
| | Heat crack resistance | C | B | C | A | B | C | C | B | C | C |
| | Heat discoloration resistance | D | D | D | A | A | D | D | D | D | C |
| | Light discoloration resistance | D | D | D | A | A | D | D | A | B | B |
| | Reflectance | 82 | 83 | 82 | 84 | 84 | 80 | 80 | 83 | 84 | 84 |
| | Adhesiveness | A | A | A | A | A | A | A | A | A | A |
| | Pencil hardness | 5H | 5H | 5H | 4H | 4H | 5H | 5H | 4H | 5H | 5H |

The invention claimed is:

1. A solder resist composition comprising:

(A) a carboxyl group-containing resin;

(B) an epoxy compound;

(C) titanium dioxide;

(D) a photopolymerization initiator; and (E) an antioxidant, the component (B) containing a hydroquinone epoxy compound represented by following formula (1),

[Chemical 1]

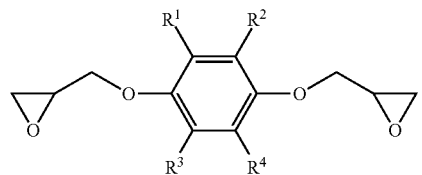

(1)

the component (D) containing (D1) a bisacylphosphine oxide-containing photopolymerization initiator and (D2) an α-hydroxy alkylphenone-containing photopolymerization initiator, $R^1$, $R^2$, $R^3$, and $R^4$ in the formula (1) being independently a methyl group, a hydrogen atom, or a t-butyl group; and a melting point of the component (E) is within a range of 50 to 150° C.

2. The solder resist composition according to claim 1 further comprising (F) a photopolymerizable monomer.

3. The solder resist composition according to claim 2, wherein
the component (F) contains a caprolactone-modified (meth)acrylate monomer.

4. The solder resist composition according to claim 1, wherein
the component (D) does not contain a monoacylphosphine oxide-containing photopolymerization initiator.

5. The solder resist composition according to claim 1, wherein
the component (A) contains an aromatic ring-containing (meth)acrylic copolymer resin.

6. A covered-printed wiring board, comprising:
a printed wiring board; and
a solder resist layer covering the printed wiring board,
the solder resist layer including a cured product of the solder resist composition according to claim 1.

* * * * *